United States Patent
Worley

(10) Patent No.: US 6,754,121 B2
(45) Date of Patent: Jun. 22, 2004

(54) SENSE AMPLIFYING CIRCUIT AND METHOD

(75) Inventor: James L. Worley, Flower Mound, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/113,304

(22) Filed: Mar. 29, 2002

(65) Prior Publication Data

US 2003/0185076 A1 Oct. 2, 2003

(51) Int. Cl.[7] .............................................. G11C 7/02
(52) U.S. Cl. ...................... 365/207; 365/154; 365/156
(58) Field of Search ................................ 365/207, 205, 365/208, 154, 156, 203, 185.21, 189.01; 327/57

(56) References Cited

U.S. PATENT DOCUMENTS

| | | | | |
|---|---|---|---|---|
| 4,130,897 A | * | 12/1978 | Horne et al. | 365/205 |
| 4,238,841 A | * | 12/1980 | Clemen et al. | 365/203 |
| 4,894,559 A | * | 1/1990 | Kaneko | 327/57 |
| 4,973,864 A | * | 11/1990 | Nogami | 327/55 |
| 5,434,544 A | * | 7/1995 | Van Veenendaal | 331/117 R |
| 5,905,686 A | | 5/1999 | Raad | 365/207 |
| 6,314,028 B1 | | 11/2001 | Kono | 365/189.09 |

OTHER PUBLICATIONS

European Search Report for Application No. EP 03 25 1932, mailed Jul. 25, 2003.

* cited by examiner

*Primary Examiner*—Gene Auduong
(74) *Attorney, Agent, or Firm*—Lisa K. Jorgenson; Andre Szuwalski

(57) ABSTRACT

A sense amplifier for use in memory devices. The sense amplifier may include a pair of cross-coupled inverters, each inverter including at least two transistors. The sense amplifier may further include a first capacitor coupled to a first input/output terminal of the sense amplifier and a second capacitor coupled to a second input/output terminal thereof. A change in voltage differential appearing across the input/output terminals bootstraps the cross-coupled inverters to facilitate activation and deactivation of the transistors in the cross-coupled inverters. Consequently, response time of the sense amplifier is reduced.

39 Claims, 2 Drawing Sheets

SENSE AMPLIFYING CIRCUIT AND METHOD

BACKGROUND OF THE INVENTION

1. Technical Field of the Invention

The present invention relates to sense amplification, and particularly to sense amplifier circuits for memory devices having improved operating characteristics.

2. Description of the Related Art

Sense amplifiers have been employed in memory devices for decades. In general terms, a conventional sense amplifier is coupled to an addressed memory cell via a pair of bit lines. When an addressed memory cell is coupled to at least one bit line of the pair of bit lines, a charge differential is developed across the bit line pair. The conventional sense amplifier senses the charge differential appearing across the bit lines of the bit line pair and drives the bit lines to high and low reference voltage levels based upon the polarity of the charge differential. A conventional sense amplifier circuit for a static random access memory (SRAM) and a dynamic random access memory (DRAM) typically includes cross-coupled logic inverters.

Electronic devices, including memory devices, are valued based in part upon their speed. Electronic devices having higher speeds are generally more desirable than similar electronic devices having lower speeds. In this regard, memory devices are valued based in part upon their memory access time. Memory devices having shortened memory access times desirably allow systems employing data storage to perform system operations with increased speed. Consequently, there is an ongoing need for memory devices to have reduced memory access times.

SUMMARY OF THE INVENTION

Exemplary embodiments of the present invention provide an improvement over existing sense amplifier circuits for memory devices. In an exemplary embodiment of the present invention, the sense amplifier includes a pair of cross-coupled inverters, with each inverter including at least two transistors. The sense amplifier may further include a first capacitor coupled to a first input/output terminal of the sense amplifier and a second capacitor coupled to a second input/output terminal of the sense amplifier. In this way, a change in voltage appearing across the first input/output terminal and the second input/output terminal bootstraps the cross-coupled inverters to facilitate activation and deactivation of the transistors forming the cross-coupled inverters. The employment of the first and second capacitors is seen to improve the sensitivity and the response time of the sense amplifier.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
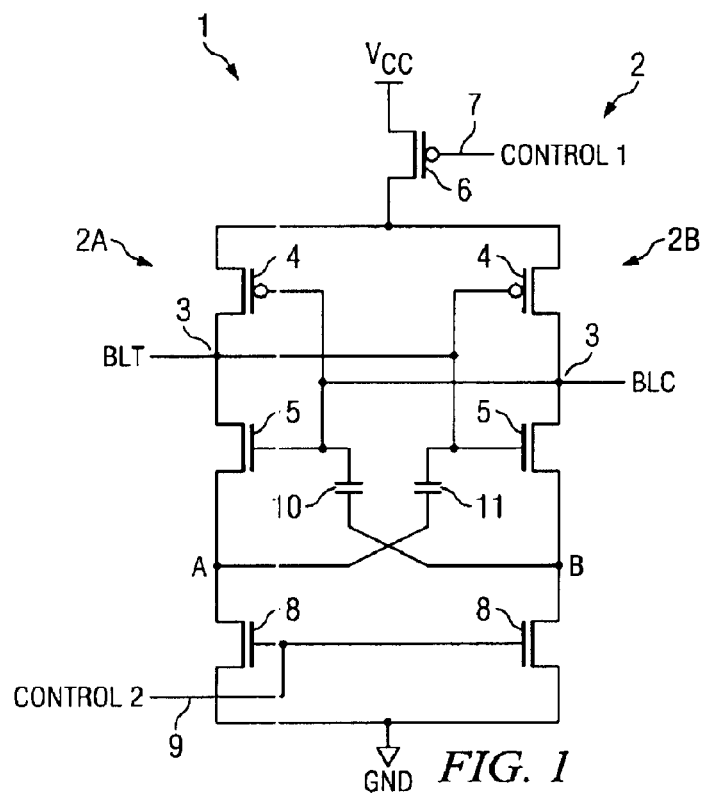
FIG. 1 is a schematic diagram of a sense amplifier circuit according to a first exemplary embodiment of the present invention.

Referring to FIG. 1, there is shown a sense amplifier circuit 1 according to an exemplary embodiment of the present invention. Sense amplifier circuit 1 may be used in any of a variety of memory devices, such as a dynamic random access memory device and a static random access memory device. Sense amplifier circuit 1 may include a pair of cross-coupled inverters 2 having two input/output terminals 3. The input of a first inverter 2A is coupled to an output of a second inverter 2B, and the input of the second inverter 2B is coupled to the output of the first inverter 2A. When activated and/or powered, each inverter 2 may perform a logical inversion operation such that the output of inverter 2 may be the logical inverse of the input thereof.

Each inverter 2 of sense amplifier circuit 1 may include a pull-up transistor 4 that pulls the output of the inverter 2 towards a high reference voltage level (Vcc) when activated. Each inverter 2 may further include a pull-down transistor 5 coupled to the pull-up transistor 4 and which pulls the output of the inverter 2 towards a low reference voltage level, such as a ground reference, when activated. Although pull-up transistors 4 and pull-down transistors 5 are illustrated in FIG. 1 as p-channel and n-channel field effect transistors, respectively, it is understood that pull-up transistors 4 and pull-down transistors 5 may be transistors of different types.

Sense amplifier circuit 1 may include circuitry for selectively activating and/or providing power and ground connections to inverters 2. A transistor 6 may be coupled between the pull-up transistor 4 of each inverter 2 and the high reference voltage level (Vcc). A control/gate terminal of transistor 6 may be driven by a first control signal 7 to selectively connect the source terminal of pull-up transistors 4 to the high reference voltage level.

The circuitry for selectively activating inverters 2 may further include a transistor 8 connected in series with pull-up transistor 4 and pull-down transistor 5 in each inverter 2. A control/gate terminal of transistor 8 may be driven by a second control signal 9 to selectively connect the source terminal of pull-down transistors to the low reference voltage level.

Transistor 6 may be a p-channel field effect transistor and transistors 8 may be n-channel field effect transistors, but it is understood that transistors 6 and 8 may be different types of transistors.

Sense amplifier circuit 1 may include a pair of capacitors coupled to the transistors in inverters 2 to facilitate the sensitivity and response time of sense amplifier circuit 1. In particular, sense amplifier circuit 1 may include a capacitor 10 coupled between the input of inverter 2A and the drain terminal of transistor 8 coupled to inverter 2B and the source terminal of pull-down transistor 5 of inverter 2B. Sense amplifier circuit 1 may further include a capacitor 11 coupled between the input of inverter 2B and the drain terminal of transistor 8 coupled to inverter 2A and the source terminal of pull-down transistor 5 of inverter 2A. Capacitors 10 and 11 bootstrap the drain terminal of transistors 8 to facilitate the activation (turn on) and deactivation (turn off) of pull-down transistors 5 of inverters 2.

The operation of sense amplifier circuit 1 will be described. Sense amplifier circuit 1 is initially deactivated or disconnected from the high and low reference voltage levels at the beginning of a memory access operation. Around this time, the bit lines BLT and BLC, to which the two input/output terminals 3 of sense amplifier circuit 1 are connected, are precharged and equilibrated to a voltage level, such as an intermediate voltage level between the high and low reference voltage levels. Next, the bit lines BLT and BLC are then connected to an addressed memory cell, which results in a voltage differential appearing across bit lines BLT and BLC. The voltage drop may, for example, be created from the voltage appearing on one of the bit lines, such as bit line BLT, slightly increasing and the voltage appearing on the other bit line (BLC) slightly decreasing.

Next, control signal 9 is driven to a logic high level to activate transistors 8. Shortly thereafter, control signal 7 is driven to a logic low level to activate transistor 6. The activation of transistors 6 and 8 causes sense amplifier circuit 1 to sense the voltage differential appearing across bit lines BLT and BLC and drive the bit lines to the high and low reference voltage levels based upon the polarity of the voltage differential. In this exemplary operation, sense amplifier circuit 1 drives bit line BLT towards the high reference voltage level and bit line BLC towards the low reference voltage level. When this occurs, capacitor 11 bootstraps node A so that the voltage appearing at node A is at least temporarily pulled upwardly to follow the voltage increase appearing on bit line BLT. When bit line BLC is driven towards the low reference voltage level, capacitor 10 bootstraps node B so that the voltage appearing on node B is at least temporarily pulled downwardly to follow the voltage decrease appearing on bit line BLC. The voltage on node A being pulled upwardly (due to the capacitor 11) combined with node B being pulled downwardly (due to capacitor 10) results in transistor 5 of inverter 2A being turned off more quickly than in conventional sense amplifier designs. Similarly, the voltage on node B being pulled downwardly (due to the capacitor 10) combined with node A being pulled upwardly (due to capacitor 11) results in transistor 5 of inverter 2B being activated more quickly than in conventional sense amplifier designs. This results of transistors 5 of inverters 2A and 2B being deactivated and activated, respectively, more quickly is that sense amplifier circuit 1 is more sensitive and/or responsive to a voltage differential appearing across corresponding bit lines BLT and BLC.

Figure 2:
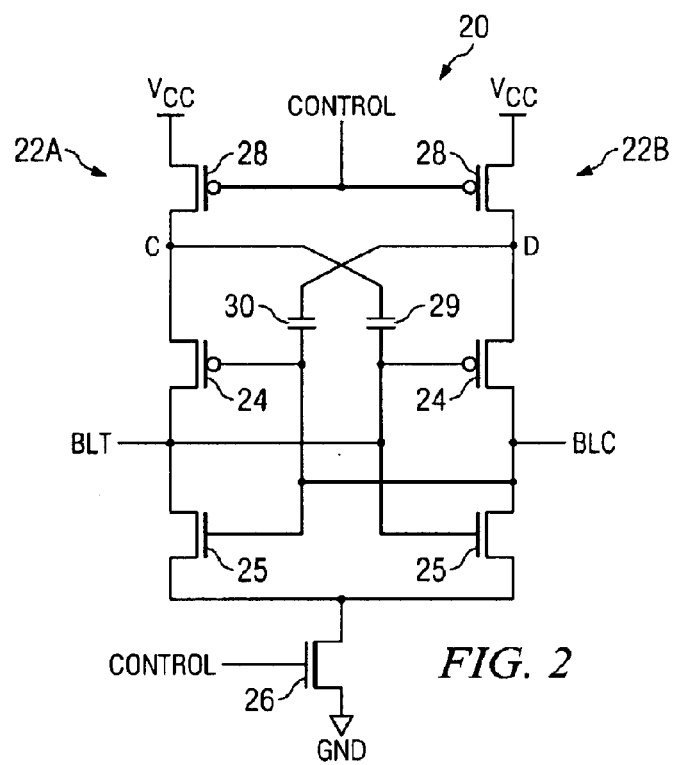
FIG. 2 is a schematic diagram of a sense amplifier circuit according to a second exemplary embodiment of the present invention.

FIG. 2 shows a sense amplifier circuit 20 according to a second exemplary embodiment of the present invention. Sense amplifier circuit 20 has a circuit structure that is similar to the circuit structure of sense amplifier circuit 1 of FIG. 1. Sense amplifier circuit 20 may include a pair of cross-coupled inverters 22A and 22B, each of which may include a pull-up transistor 24, such as a p-channel field effect transistor, and a pull-down transistor 25, such as an n-channel field effect transistor. Sense amplifier circuit 20 may further include a transistor 26, such as an n-channel field effect transistor, coupled between the source terminal of transistors 25 and the low reference voltage level. Each inverter 22 may be series connected with a distinct transistor 28 coupled between the source terminal of pull-up transistor 24 of inverter 22 and the high reference voltage level. Control signals may be applied to transistors 26 and 28 so as to activate and/or supply power to sense amplifier circuit 30.

Sense amplifier circuit 20 may further include a first capacitor 29 coupled between the source terminal of transistor 24 of inverter 22A (i.e., node C in FIG. 2) and the input terminal of inverter 22B (i.e., the gate/control terminals of transistors 24 and 25 of inverter 22B). A capacitor 30 may be coupled between the source terminal of transistor 24 of inverter 22B (i.e., node D in FIG. 2) and the input terminal of inverter 22A (i.e., the gate/control terminals of transistors 24 and 25 of inverter 22A). Capacitors 29 and 30 serve to activate/deactivate transistors 24 of inverters 22A and 22B, respectively, more quickly during a memory access operation.

Specifically, as a voltage differential is generated across bit lines BLT and BLC (due to initially connecting an addressed memory cell to either of bit lines BLT and BLC and subsequently driving, by sense amplifier circuit 20, the bit lines BLT and BLC towards the high and low reference voltage levels), capacitors 29 and 30 bootstrap or pull nodes C and D, respectively, so as to more quickly activate and deactivate transistors 24. For instance, if bit line BLT is driven by sense amplifier circuit 20 towards the high reference voltage level and bit line BLC is driven towards the low reference voltage level, node C is bootstrapped by capacitor 29 to be pushed towards the high reference voltage level and node D is bootstrapped to be pulled towards the low reference voltage level. Node C being increased and node D being decreased in this manner has the effect of more quickly turning on transistor 24 of inverter 22A and turning off transistor 24 of inverter 22B. Consequently, bit lines BLT and BLC are more quickly driven to the high and low reference voltage levels, respectively.

Figure 3:
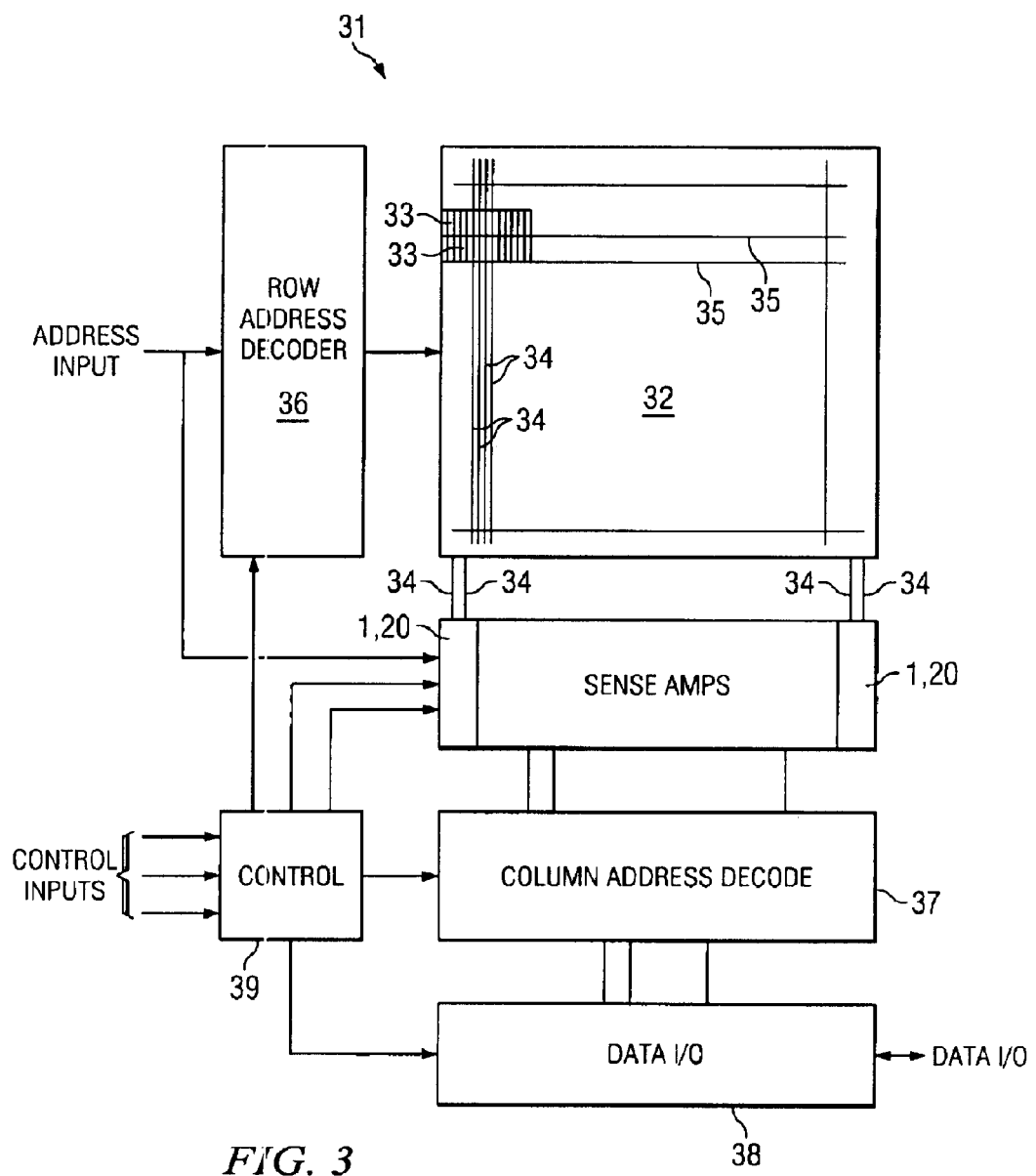
FIG. 3 is a block diagram of a memory device having therein the sense amplifier circuit of FIG. 1.

Referring to FIG. 3, there is shown a memory device 31 according to an exemplary embodiment of the present invention. Memory device 31 may include an array 32 of memory cells 33 organized into rows and columns. Each column of memory cells 33 may be coupled to a distinct bit line 34 and each row of memory cells 33 may be coupled to a distinct row line 35. Row address decode circuitry 36 may receive an address value and drive one of the row lines 35 based upon the value of the received address value. Column address decode circuitry 37 may receive the address value and select a number of bit lines 34 based upon the received address value. Input/output circuitry 38 may serve as the interface between the data input/output of memory device 31 and the bit lines 34 selected by column address decode circuitry 37. Memory device 31 may further include control circuitry 39 for providing timing and other control signals for performing memory access operations. The control circuitry may include precharge and equilibrate circuitry for precharging and equilibrating bit lines 34 at the onset of a memory access operation.

Memory device 31 may include a number of sense amplifier circuits, such as sense amplifier circuits 1 or 20. Each sense amplifier circuit 1 (or 20) may be coupled to a pair of bit lines 34 and, when activated, sense the voltage differential appearing thereon and drive the bit lines 34 towards the high and low reference voltage levels based upon the polarity of the voltage differential. The use of capacitors 9 and 10 (for sense amplifier circuit 1) and capacitors 29 and 30 (for sense amplifier circuit 20) allows for a faster sense amplification during memory access operations.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sense amplifier circuit, comprising:
   a first inverter coupled between a first reference voltage level and a second reference voltage level;
   a second inverter cross-coupled with the first inverter and coupled between the first reference voltage level and the second reference voltage level;
   a first transistor coupled between the second inverter and the second reference voltage level; and
   a first capacitor coupled between an input of the first inverter and a node coupling the second inverter to the first transistor.

2. The sense amplifier circuit of claim 1, further comprising:
   a second transistor coupled between the first inverter and the second reference voltage level; and
   a second capacitor coupled between an input of the second inverter and a node coupling the first inverter to the second transistor.

3. The sense amplifier circuit of claim 1, wherein a control terminal of the first and second transistors is driven by a control signal that activates the sense amplifier circuit.

4. The sense amplifier circuit of claim 1, further comprising a second transistor coupled between the first reference voltage level and the first and second inverters, a control terminal of the second transistor being driven by a control signal that activates the sense amplifier circuit.

5. The sense amplifier circuit of claim 1, wherein the first reference voltage level is a power supply voltage level and the second reference voltage level is a ground reference.

6. The sense amplifier circuit of claim 1, wherein the first reference voltage level is a ground reference voltage level and the second reference voltage level is a power supply voltage reference.

7. The sense amplifier circuit of claim 1, wherein the first inverter comprises at least two field effect transistors, the second inverter comprises at least two field transistors.

8. The sense amplifier circuit of claim 1, further comprising:
   at least one second transistor coupled in series between the first reference voltage level and each of the first and second inverters, a control terminal of the at least one second transistor being coupled to a control signal for selectively activating and deactivating the at least one second transistor.

9. The sense amplifier circuit of claim 8, further comprising at least one third transistor coupled in series between the second reference voltage level and the first inverter, a control terminal of the at least one third transistor being coupled to a control terminal of the first transistor and to a second control signal for selectively activating and deactivating the first transistor and the at least one third transistor.

10. A memory device, comprising:
    a plurality of memory cells and a pair of bit lines coupled to the memory cells;
    address decode circuitry having an input coupled to receive an input address and a plurality of outputs coupled to the memory cells, for selecting a memory cell corresponding to the value of the input address; and
    a sense amplifier coupled to the pair of bit lines, the sense amplifier comprising cross-coupled inverters having input-output terminals coupled to the pair of bit lines, each inverter including at least two transistors, the sense amplifier further including a capacitor coupled between a first bit line of the pair of bit lines and an inverter of the cross-coupled inverters so that a change in voltage appearing on the first bit line bootstraps the cross-coupled inverters to facilitate activation and deactivation of a transistor in the cross-coupled inverters.

11. The memory device of claim 10, wherein a first inverter of the cross-coupled inverters comprises a pull-up transistor, a pull-down transistor, and the memory device further comprises an enable transistor connected in series with the pull-up transistor and the pull-down transistor, control terminals of the pull-up and pull-down transistors of the first inverter are coupled to a second bit line of the pair of bit lines, and the capacitor has a first plate coupled to the first bit line and a second plate coupled to the enable transistor.

12. The memory device of claim 11, wherein the enable transistor is a field effect transistor and the second plate of the capacitor is coupled to a drain terminal of the enable transistor.

13. The memory device of claim 11, wherein the pull-up transistor and the pull-down transistor of the first inverter comprise field effect transistors, and the second plate of the capacitor is coupled to a source terminal of one of the pull-up and pull-down transistors.

14. The memory device of claim 13, wherein the enable transistor is coupled between the pull-down transistor and a low reference voltage level.

15. The memory device of claim 13, wherein the enable transistor is coupled between the pull-up transistor and a high reference voltage level.

16. The memory device of claim 10, wherein the sense amplifier further includes a second capacitor coupled to the second bit line of the pair of bit lines so that a change in voltage appearing on the second bit line bootstraps the cross-coupled inverters to facilitate activation and deactivation of a second transistor in the cross-coupled inverters.

17. The memory device of claim 16, wherein a second inverter of the cross-coupled inverters comprises a pull-up transistor and a pull-down transistor, and the sense amplifier further includes a second enable transistor connected in series with the pull-up transistor and the pull-down transistor of the second inverter, control terminals of the pull-up and pull-down transistors of the second inverter are coupled to the first bit line of the pair of bit lines, and the second capacitor has a first plate coupled to the second bit line and a second plate coupled to the second enable transistor.

18. The memory device of claim 17, wherein the second enable transistor is a field effect transistor and the second plate of the second capacitor is coupled to a drain terminal of the second enable transistor.

19. The memory device of claim 18, wherein the pull-up transistor and the pull-down transistor of the second inverter comprise field effect transistors, and the second plate of the second capacitor is coupled to a source terminal of one of the pull-up and pull-down transistors of the second inverter.

20. The memory device of claim 19, wherein the second enable transistor is coupled between the pull-down transistor of the second inverter and a low reference voltage level.

21. The memory device of claim 19, wherein the second enable transistor is coupled between the pull-up transistor of the second inverter and a high reference voltage level.

22. The memory device of claim 10, wherein the sense amplifier further comprises:
    a first transistor coupled in series between a first of the cross-coupled inverters and a first reference voltage level, a control terminal of the first transistor coupled to a first control signal for selectively activating and deactivating the first transistor;

a second transistor coupled in series between a second of the cross-coupled inverters and the first reference voltage level, a control terminal of the second transistor coupled to the first control signal for selectively activating and deactivating the second transistor, the capacitor being coupled to a node coupling the second transistor and the second of the cross-coupled inverters; and at least one third transistor coupled in series between a second reference voltage level and each of the cross-coupled inverters, a control terminal of the at least one third transistor being coupled to a second control signal for selectively activating and deactivating the at least one third transistor.

23. The memory device of claim 22, further comprising a control circuit providing the first and second control signals, the first and second transistors being activated by the control circuit during a memory access operation prior to the at least one third transistor being activated during the memory access operation.

24. The memory device of claim 10, wherein each of the cross-coupled inverters comprises a p-channel transistor and an n-channel transistor.

25. A sense amplifier for use in a memory device, comprising cross-coupled inverters, each inverter including at least two transistors, the sense amplifier further including a capacitor coupled to a first input/output terminal of the sense amplifier so that a change in voltage appearing on the first input/output bootstraps the cross-coupled inverters to facilitate activation and deactivation of a transistor in the cross-coupled inverters.

26. The sense amplifier of claim 25, wherein a first inverter of the cross-coupled inverters comprises a pull-up transistor and a pull-down transistor, and the sense amplifier further includes an enable transistor connected in series with the pull-up transistor and the pull-down transistor, control terminals of the pull-up and pull-down transistors of the first inverter are coupled to a second input/output terminal of the sense amplifier, and the capacitor has a first plate coupled to the first input/output terminal and a second plate coupled to the enable transistor.

27. The sense amplifier of claim 26, wherein the enable transistor is a field effect transistor and the second plate of the capacitor is coupled to a drain terminal of the enable transistor.

28. The sense amplifier of claim 27, wherein the pull-up transistor and the pull-down transistor of the first inverter comprise field effect transistors, and the second plate of the capacitor is coupled to a source terminal of one of the pull-up and pull-down transistors.

29. The sense amplifier of claim 28, wherein the enable transistor is coupled between the pull-down transistor and a low reference voltage level.

30. The sense amplifier of claim 28, wherein the enable transistor is coupled between the pull-up transistor and a high reference voltage level.

31. The sense amplifier of claim 25, wherein the sense amplifier further includes a second capacitor coupled to the second input/output terminal so that a change in voltage appearing on the second input/output terminal bootstraps the cross-coupled inverters to facilitate activation and deactivation of one or more transistors in the cross-coupled inverters.

32. The sense amplifier of claim 31, wherein a second inverter of the cross-coupled inverters comprises a pull-up transistor and a pull-down transistor, and the sense amplifier further includes a second enable transistor connected in series with the pull-up transistor and the pull-down transistor of the second inverter, control terminals of the pull-up and pull-down transistors of the second inverter are coupled to the first input/output terminal, and the second capacitor has a first plate coupled to the second input/output terminal and a second plate coupled to the second enable transistor.

33. The sense amplifier of claim 32, wherein the second enable transistor is a field effect transistor and the second plate of the second capacitor is coupled to a drain terminal of the second enable transistor.

34. The sense amplifier of claim 33, wherein the pull-up transistor and the pull-down transistor of the second inverter comprise field effect transistors, and the second plate of the second capacitor is coupled to a source terminal of one of the pull-up and pull-down transistors of the second inverter.

35. The sense amplifier of claim 34, wherein the second enable transistor is coupled between the pull-down transistor of the second inverter and a low reference voltage level.

36. The sense amplifier of claim 34, wherein the second enable transistor is coupled between the pull-up transistor of the second inverter and a high reference voltage level.

37. The sense amplifier of claim 25, further comprising:

a first transistor coupled in series between a first of the cross-coupled inverters and a first reference voltage level, a control terminal of the first transistor coupled to a first control signal for selectively activating and deactivating the first transistor;

a second transistor coupled in series between a second of the cross-coupled inverters and the first reference voltage level, a control terminal of the second transistor coupled to the first control signal for selectively activating and deactivating the second transistor, the capacitor being coupled to a node coupling the second transistor to the second of the cross-coupled inverters; and at least one third transistor coupled in series between a second reference voltage level and each of the cross-coupled inverters, a control terminal of the at least one third transistor being coupled to a second control signal for selectively activating and deactivating the at least one third transistor.

38. An apparatus, comprising:

a plurality of memory cells and a pair of bit lines coupled to the memory cells;

address decode circuitry having an input coupled to receive an input address and a plurality of outputs coupled to the memory cells, for selecting a memory cell corresponding to the value of the input address; and a sense amplifier coupled to the pair of bit lines, the sense amplifier consisting essentially of:

cross-coupled logic inverters having input-output terminals coupled to the pair of bit lines, each logic inverter including at least two transistors;

a first capacitor coupled between a first bit line of the pair of bit lines and a first of the cross-coupled logic inverters so that a change in voltage appearing on the first bit line bootstraps the cross-coupled logic inverters to facilitate activation and deactivation of at least one transistor in the cross-coupled logic inverters;

a second capacitor coupled between a second bit line of the pair of bit lines and a second of the cross-coupled logic inverters so that a change in voltage appearing on the second bit line bootstraps the cross-coupled logic inverters to facilitate activation and deactivation of at least one other transistor in the cross-coupled logic inverters;

a first transistor coupled in series between the first of the cross-coupled logic inverters and a first reference voltage level, a control terminal of the first transistor being coupled to a first control signal;

a second transistor coupled in series between the second of the cross-coupled logic inverters and the first reference voltage level, a control terminal of the second transistor being coupled to the first control signal; and at least one third transistor coupled in series between the cross-coupled logic inverters and a second reference voltage level, a control terminal of the second transistor being coupled to a second control signal.

39. The apparatus of claim 38, wherein the memory cells, the address decode circuitry and the sense amplifier form at least part of a memory, and the apparatus further comprises control circuitry for generating the first and second control signals, the first control signal activating the first and second transistors during a memory access operation prior to activation of the at least one third transistor during the memory access operation.

* * * * *